United States Patent
Wang et al.

(10) Patent No.: US 8,264,184 B2
(45) Date of Patent: Sep. 11, 2012

(54) LOW-PIN COUNT FAN SPEED CONTROL SYSTEM AND A METHOD THEREOF

(75) Inventors: Yen-Hui Wang, Hsinchu (TW); Chang-Ling Sha, Hsinchu (TW); Ko-Ming Lin, Hsinchu (TW); Ko-Yen Lee, Hsinchu (TW)

(73) Assignee: Grenergy Opto, Inc., Hsinchu Science Park, Hsinchu (TW)

( * ) Notice: Subject to any disclaimer, the term of this patent is extended or adjusted under 35 U.S.C. 154(b) by 658 days.

(21) Appl. No.: 12/496,204

(22) Filed: Jul. 1, 2009

(65) Prior Publication Data
US 2011/0001445 A1    Jan. 6, 2011

(51) Int. Cl.
*H02P 1/04* (2006.01)
(52) U.S. Cl. ......... 318/473; 318/461; 318/471; 318/782
(58) Field of Classification Search .................. 318/461, 318/471, 472, 473, 782, 783
See application file for complete search history.

(56) References Cited

U.S. PATENT DOCUMENTS

| | | | | |
|---|---|---|---|---|
| 5,197,858 | A * | 3/1993 | Cheng | 417/14 |
| 6,040,668 | A * | 3/2000 | Huynh et al. | 318/471 |
| 6,188,189 | B1 * | 2/2001 | Blake | 318/471 |
| 7,098,617 | B1 * | 8/2006 | Oljaca et al. | 318/268 |
| 7,495,407 | B2 * | 2/2009 | Huang et al. | 318/599 |
| 7,609,018 | B2 * | 10/2009 | Lin et al. | 318/471 |
| 7,949,233 | B2 * | 5/2011 | Chiang et al. | 388/811 |

FOREIGN PATENT DOCUMENTS
TW    I306134    2/2009
* cited by examiner

*Primary Examiner* — Walter Benson
*Assistant Examiner* — Thai Dinh
(74) *Attorney, Agent, or Firm* — Winston Hsu; Scott Margo

(57) ABSTRACT

A low-pin count fan speed control system and a method thereof include primarily an activation unit to drive a fan to operate. When the fan starts completely, the fan slows down to a pre-determined rotation speed through an idle speed regulation unit. After achieving a pre-determined temperature through a temperature transition unit, the fan speed beings to increase from the idle speed. When the fan is operating, the rotation speed is properly increased in proportion to the temperature, using a positive temperature regulation slope unit. Therefore, through this method, the rotation speed will not be decreased by foreign objects when the fan is operating and a computer host can be provided with proper heat dissipation.

7 Claims, 8 Drawing Sheets the present invention relates to low-pin count fan speed
LOW-PIN COUNT FAN SPEED CONTROL SYSTEM AND A METHOD THEREOF

BACKGROUND OF THE INVENTION (a) Field of the Invention

The present invention relates to low-pin count fan speed control and more particularly to a low-pin count fan speed control system and a method thereof, wherein fewest pins (4, 5 or 6 pins) are used on a chip to achieve same functions of an existing solution with 8 pins or more.

(b) Description of the Prior Art

In a wave of technologies which are progressed continuously, a computer has already been one of indispensable tools in a life of a contemporary person and a computer has brought to the contemporary person with a lot of conveniences. The computer includes primarily a CPU (Central Processing Unit) to serve as an operating center of the computer, and a processing speed of the computer is required to be faster and faster by the contemporary person. Therefore, in order to comply with usage requirements of the contemporary person, an operating frequency of the CPU is also improved relatively fast. Yet, high temperature which is produced when the CPU is operating needs to be dissipated through a heat dissipation device and most of the heat dissipation devices use fins and air convection resulted from operation of a fan to cool down the CPU.

In terms of an ordinary fan, when a user turns on a computer host, the fan inside the computer host will start slowly until reaching to a fixed rotation speed, so that high temperature produced by the CPU can be dissipated by air convection to effectively avoid instability of the computer system by too high the temperature. Nevertheless, when the computer is used for a long time, external dusts and impurities will be adsorbed due to statics produced by operation of the fan and will be filled into the fan after being accumulated for a long time. As a voltage is smaller when the fan starts, in a beginning, a rotation speed will be affected by the dusts and impurities that the fan will be jammed or cannot operate smoothly, further causing the fan to be damaged or even unable to effectively control the CPU temperature that the computer system is unstable and down.

Moreover, an existing chip sold on a market to control the operation of the fan requires 8 pins or more that complete fan control functions can be provided. However, in spite that this chip of 8 pins or more for controlling the fan is provided with multiple functions, as there are too many pins, a packaging cost for the chip is increased and a production cost is increased as an area of PCB (Printed Circuit Board) is increased.

As a result, there are related vendors who developed a low-pin count (e.g., 5 pins) chip to attempt to reduce the production cost. Although being able to reduce the chip packaging cost, decrease the PCB area and reduce the production cost, this low-pin count chip only controls a positive temperature regulation slope unit of the fan and is not multi-functional as the previous 8-pin chip. Therefore, although the price of the low-pin count chip is cheap, the functions are not robust relatively.

SUMMARY OF THE INVENTION

The primary object of the present invention is to provide a low-pin count fan speed control system and a method thereof, wherein an activation unit provides a pre-determined voltage to drive a fan to rotate and when the fan starts completely, the fan is slowed down to a pre-determined rotation speed (i.e., idle speed) through an idle speed regulating unit. In addition, by a temperature transition unit, when temperature rises to a pre-determined temperature, the fan speed is increased from an idle speed and when the fan is operating, the rotation speed is increased properly in proportion to the temperature, by a positive temperature regulation slope unit, that after reaching the pre-determined temperature, a full rotation speed can be achieved. Next, when the temperature increases to a pre-determined temperature, an over-temperature protection unit will activate a protective notification function. Thus, through this method, the fan can operate without being affected by foreign objects or a large friction force when starting. On the other hand, a low pre-determined rotation speed (idle speed) is maintained and the rotation speed is properly increased in proportion to the temperature when the temperature is in a normal range; whereas, when the temperature is too high, the protection function is activated. Not only that this system is able to achieve the same aforementioned functions that the existing system can achieve by using more than 8 pins, but also that the production cost is reduced as the PCB area is decreased effectively, due to that the pins are decreased in the present invention.

Another object of the present invention is to provide a low-pin count fan speed control system by which the functions of the original fan chip (e.g., 8-pin chip) can be maintained and the production cost can be reduced as the PCB area is decreased effectively, due to that the pins are decreased.

To enable a further understanding of the said objectives and the technological methods of the invention herein, the brief description of the drawings below is followed by the detailed description of the preferred embodiments.

DETAILED DESCRIPTION OF THE PREFERRED EMBODIMENTS

Figure 1:
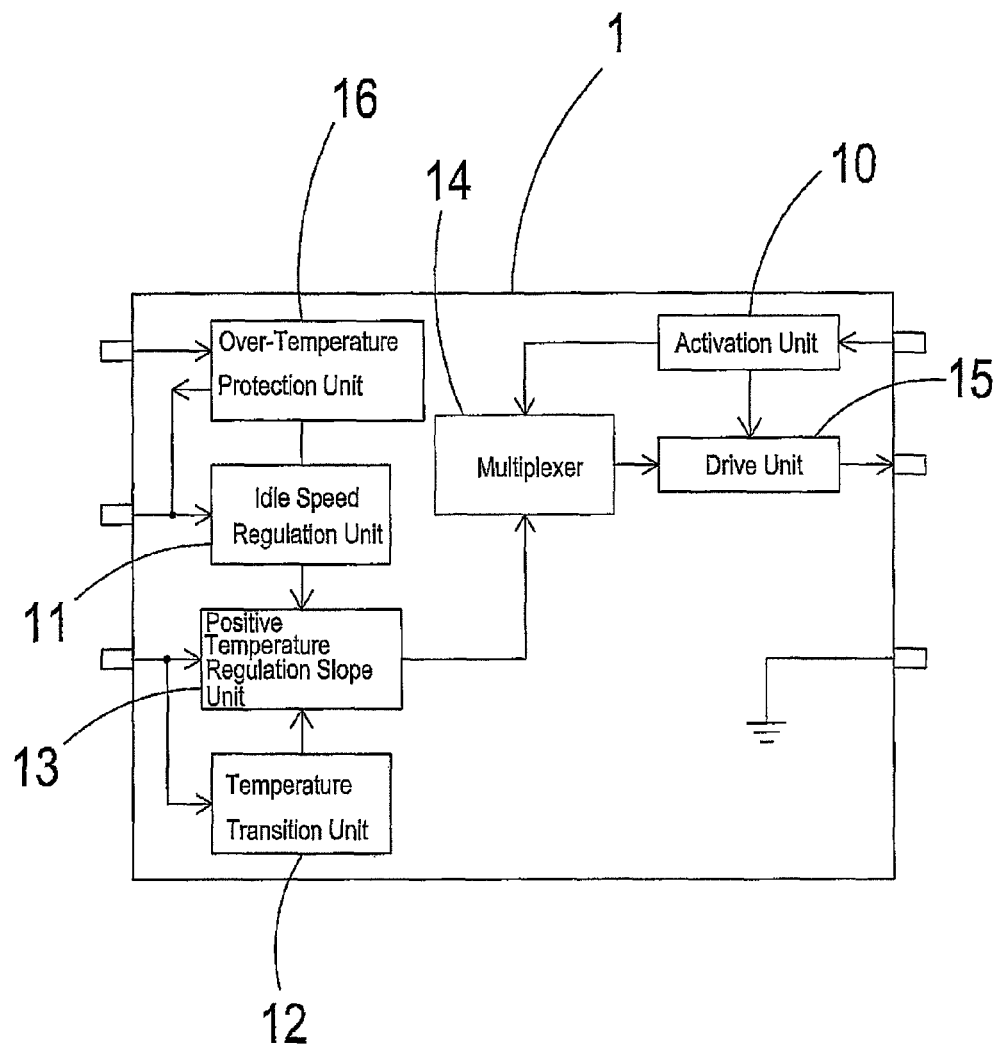
FIG. 1 shows a schematic view of structures of a fan speed control system, according to the present invention.

Referring to FIG. 1, it shows a schematic view of structures of a fan speed control system, according to the present invention. As shown in the drawing, the present invention provides a low-pin count fan speed control system and a method thereof, wherein a chip 1 used to control operation of a fan comprises an activation unit 10 (such as a linear control unit or a PWM (Pulse Width Modulation) unit), an idle speed regulation unit 11 (such as adjustable unit or a non-adjustable unit), a temperature transition unit 12 and a positive temperature regulation slope unit 13. The activation unit 10 provides a pre-determined voltage and drives the fan (not shown in the drawing) to operate, whereas after starting, the fan is regulated by the idle speed regulation unit 11 to decelerate to a pre-determined operating speed when the fan starts completely. After that, the fan begins to accelerate by a pre-determined temperature which is set up by the temperature transition unit 12, and when the rotation speed increases to a condition that the temperature reaches a pre-determined temperature set up by the positive temperature regulation slope unit 13, a full rotation speed is achieved; whereas, the temperature transition unit 12 and the positive temperature regulation slope unit 13 provide a drive signal to a drive unit 15 (such as a linear control unit or a PWM unit) through a multiplexer 14 to produce drive energy. On the other hand, to prevent the temperature from getting too high, when the temperature rises to a pre-determined temperature, an over-temperature protection unit 16 will activate a protective notification function to inform a computer host.

Figure 1A:
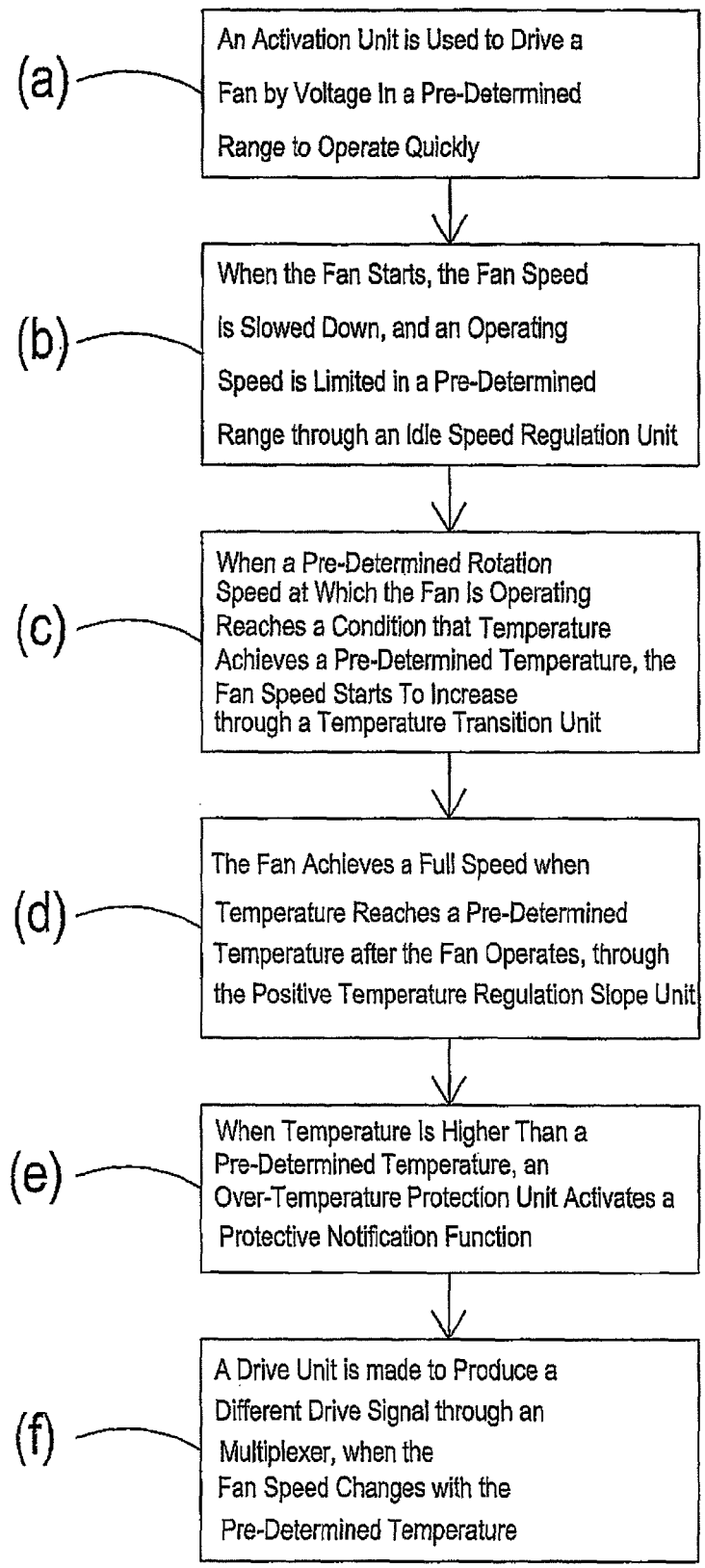
FIG. 1A shows a schematic view of steps of a fan speed control system, according to the present invention.

Referring to FIG. 1A, it shows a schematic view of steps of a fan speed control system, according to the present invention. As shown in the drawing, the steps are:

a) using the activation unit to drive the fan by a voltage in a pre-determined range to operate quickly;

b) slowing down the fan after the fan starts, and restricting the operating speed in a pre-determined range through the idle speed regulation unit;

c) starting to increase the fan speed through the temperature transition unit when the pre-determined rotation speed that the fan is operating at reaches a condition that the temperature rises to a pre-determined temperature;

d) the fan achieving a full speed when the temperature reaches a pre-determined temperature which is set up by the positive temperature regulation slop unit;

e) the over-temperature protection unit activating the protective notification function when the temperature rises to a pre-determined temperature; and f) the drive unit producing a different drive signal through the multiplexer when the fan speed changes with the pre-determined temperature.

Figure 2:
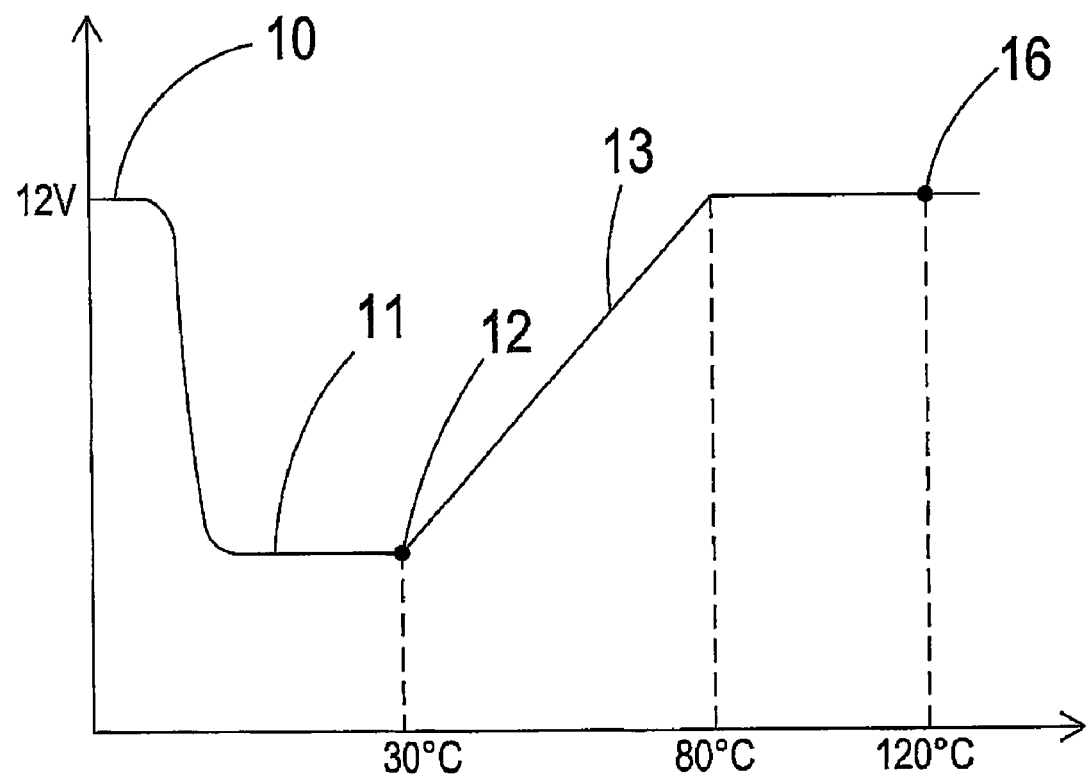
FIG. 2 shows a temperature curve of a chip of the present invention using 6 pins to control operation of a fan.

Referring to FIG. 2, it shows a temperature curve of a chip using 6 pins to control operation of a fan. As shown in the drawing and in reference to FIG. 1 at a same time, the activation unit 10 and the drive unit 15 use a PWM unit as an example, whereas the idle speed regulation unit 11 uses an adjustable unit as an example. When the voltage set up by the activation unit 10 (e.g., 12V) is reached, the fan can operate completely, and after completely operating for a while, the activation unit 10 will drop down the voltage to the range that is defined by the idle speed regulation unit 11. At this time, a client end can adjust the idle speed regulation unit 11 to define the fan speed as required. On the other hand, the client end will configure the temperature transition unit 12 to define a pre-determined temperature (e.g., 30° C.), and when the fan keeps at the original rotation speed that is defined by the idle speed regulation unit 11 and the temperature reaches the temperature that is defined by the temperature transition unit 12, the positive temperature regulation slope unit 13 will inform the drive unit 15 through the multiplexer 14 to increase drive energy to accelerate the fan. When the fan speed increases to a condition that the temperature reaches the temperature that is set up by the positive temperature regulation slope unit 13 (e.g., 80° C.), the fan can achieve a full speed. Moreover, when the temperature increases to a pre-determined temperature (e.g., 120° C.), the over-temperature protection unit 16 will active the protective notification function to inform the computer host. As the aforementioned functions can be achieved by this kind of chip 1 with only 6 pins, the PCB area can be decreased effectively to reduce the production cost as the pins are decreased.

Figure 3:
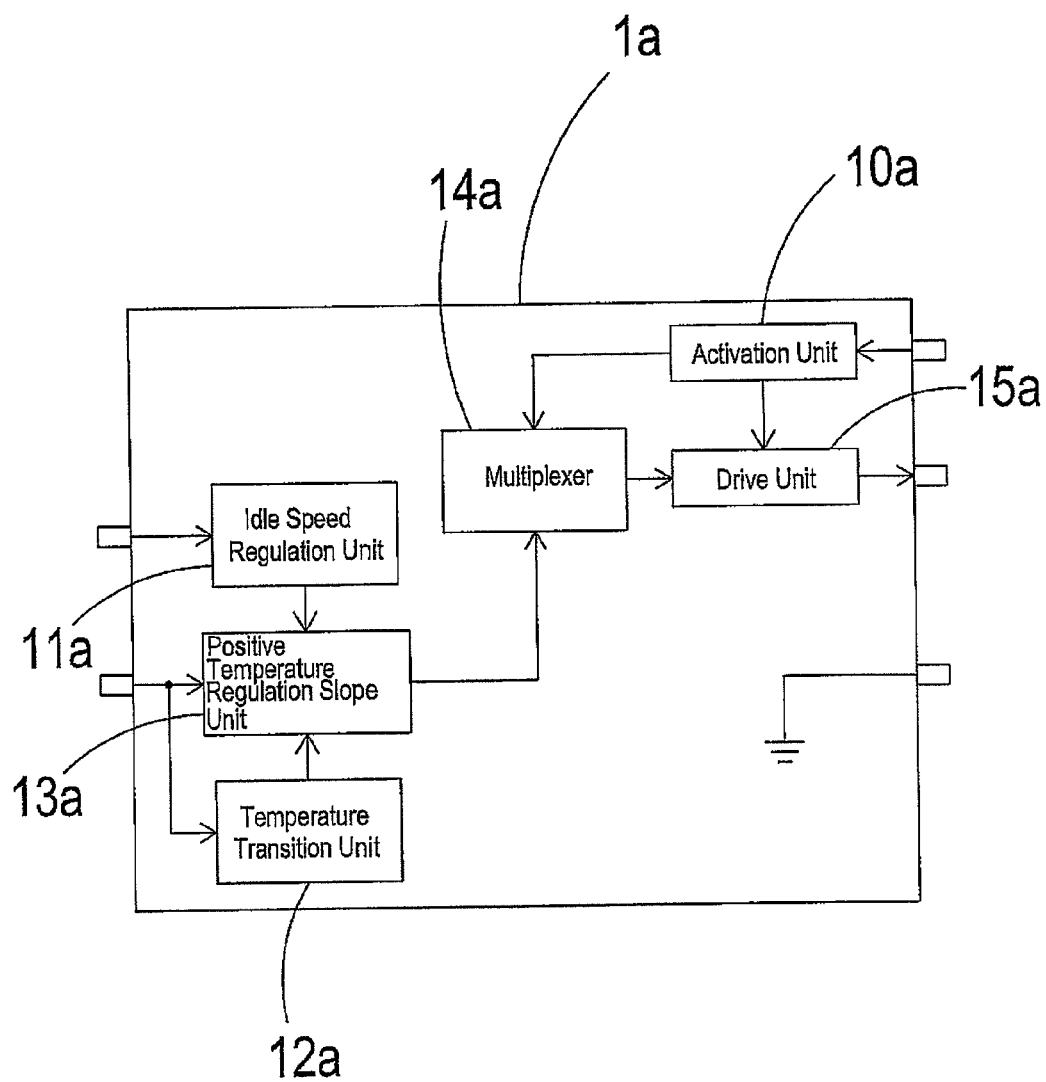
FIG. 3 shows a structural diagram of a 5-pin chip of the present invention.
Figure 4:
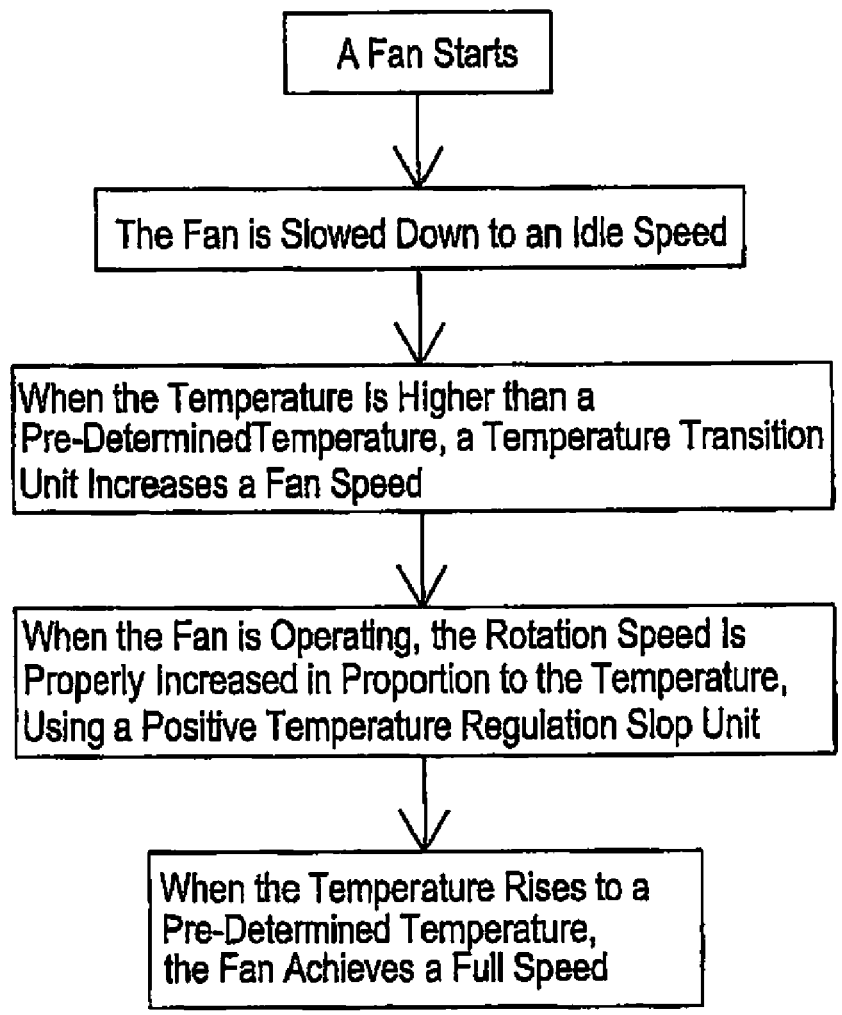
FIG. 4 shows a flow diagram of a fan speed control system with a 5-pin chip, according to the present invention.
Figure 5:
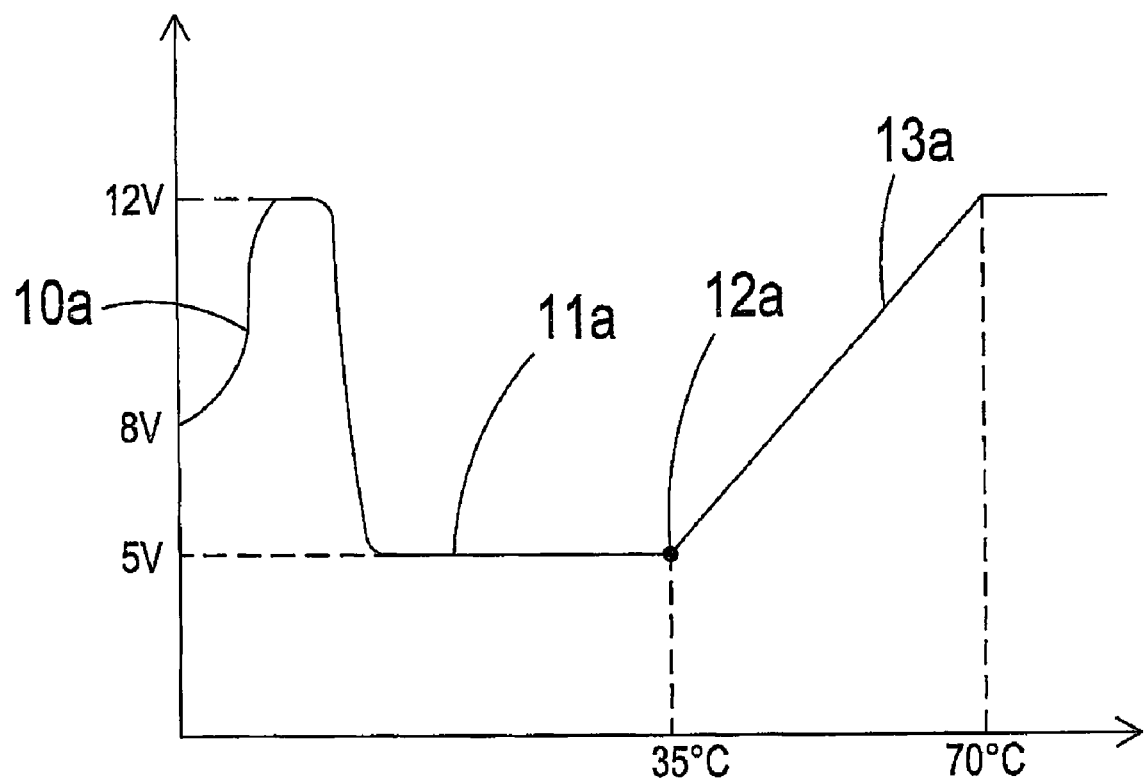
FIG. 5 shows a temperature curve of a chip of the present invention using 5 pins to control operation of a fan.

Referring to FIGS. 3 to 5, it shows a structural diagram of a 5-pin chip, a flow diagram of a fan speed control system with a 5-pin chip and a temperature curve of a 5-pin chip to control operation of a fan, according to another preferred embodiment of the present invention. As shown in the drawings, the activation unit 10a and the drive unit 15a use a linear control unit as an example, whereas the idle speed regulation unit 11a uses an adjustable unit as an example. When the voltage set up by the activation unit 10a (e.g., 8V) is reached, the fan starts. At this time, the fan voltage rises up continuously to another pre-determined voltage (e.g., 12V) and the fan (not shown in the drawings) is operating completely. After operating at the full speed for a while, the activation unit 10a will drop down the voltage again to another pre-determined voltage (e.g., 5V), and at this time, the client end can adjust the idle speed regulation unit 11a to define the fan speed as required. On the other hand, the client end will configure the temperature transition unit 12a to define a pre-determined temperature (e.g., 35° C.). When the fan keeps at the rotation speed that is defined by the idle speed regulation unit 11a and the temperature reaches the temperature that is defined by the temperature transition unit 12a, the fan speed will increase. Moreover, when the fan speed increases to a condition that the temperature reaches the temperature that is set up by the positive temperature regulation slop unit 13a (e.g., 70° C.), the fan can achieve the full speed. This change of fan speed is achieved by various drive energy of the drive unit 15a through the drive signal produced by the multiplexer 14a, according to the temperature transition unit 12a and the positive temperature regulation slope unit 13a. The aforementioned functions can be also achieved by this kind of chip 1a with only 5 pins. As a result, as the pins are decreased, the PCB area is decreased effectively to reduce the production cost.

Figure 6:
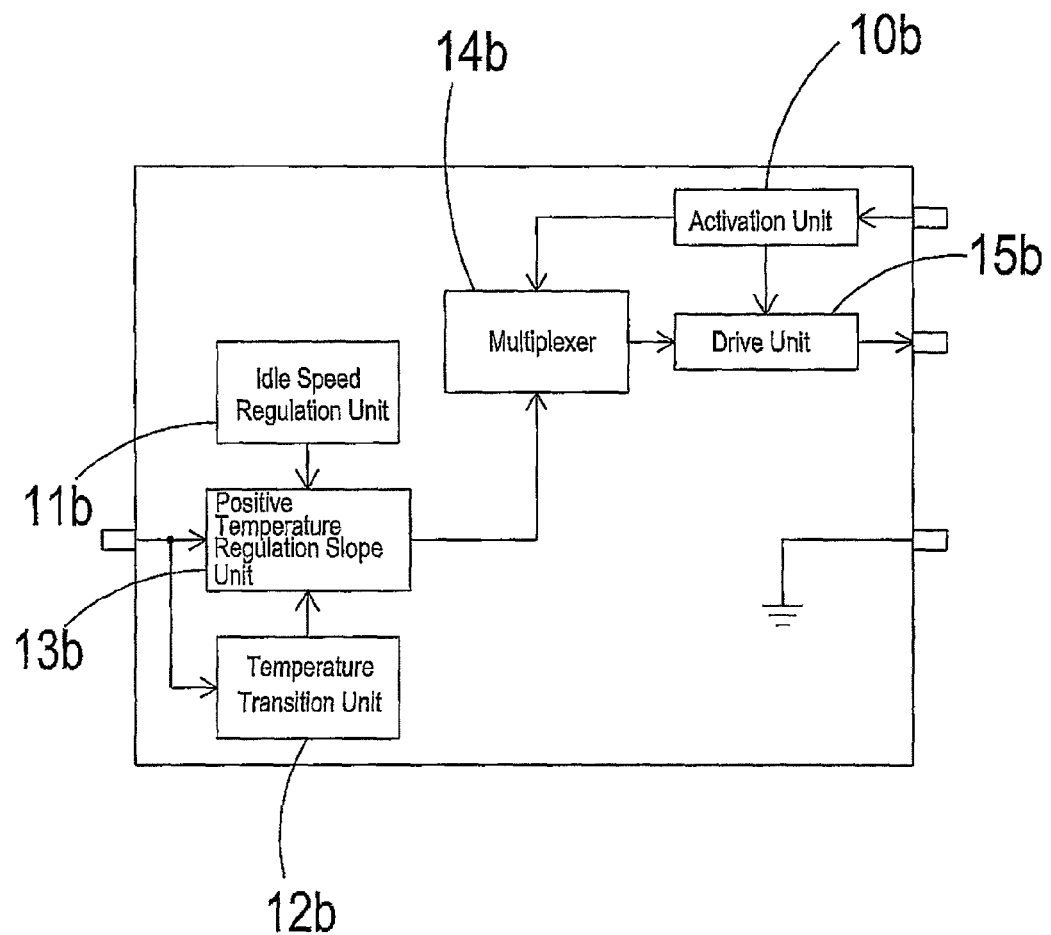
FIG. 6 shows a structural diagram of a 4-pin chip of the present invention.
Figure 7:
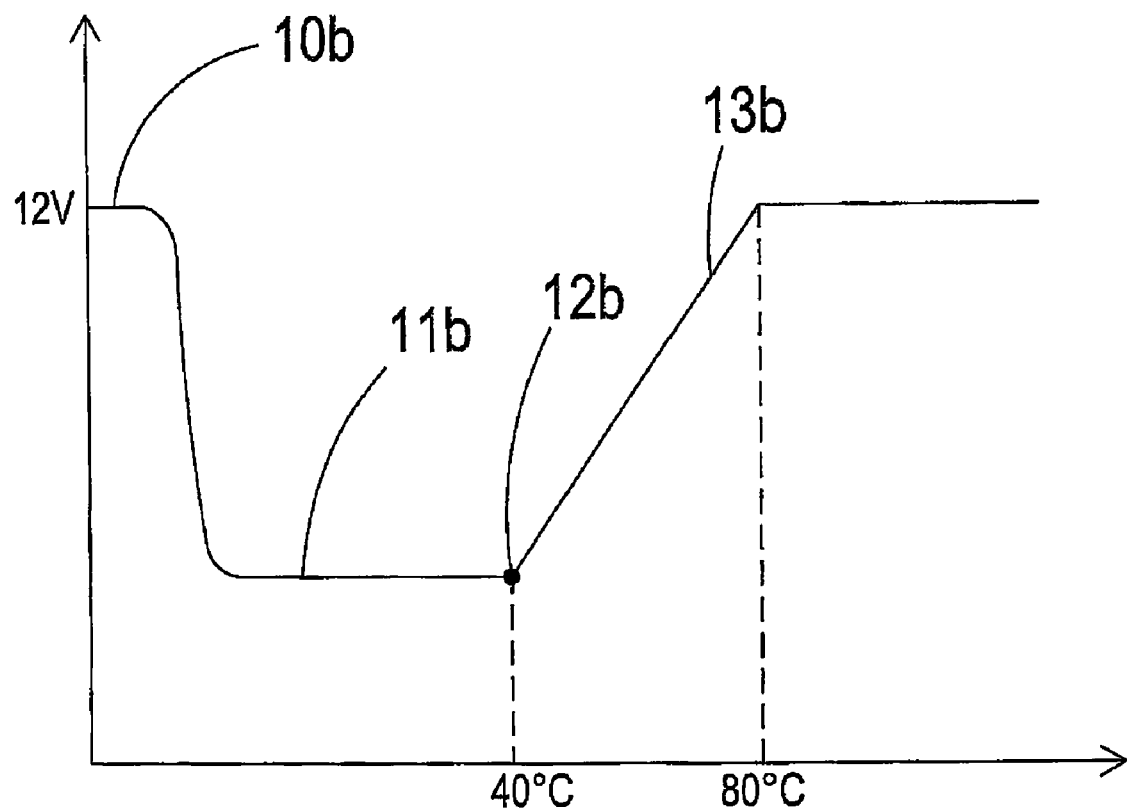
FIG. 7 shows a temperature curve of another preferred embodiment of the present invention using a 4-pin chip to control operation of a fan.

Referring to FIG. 6 and FIG. 7, it shows a structural diagram of a 4-pin chip and a temperature curve of a 4-pin chip to control operation of a fan, according to still another preferred embodiment of the present invention. As shown in the drawings, the activation unit 10b and the drive unit 15b use a PWM unit as an example, whereas the idle speed regulation unit 11b uses a non-adjustable unit as an example. When the voltage set up by the activation unit 10b (e.g., 12V) is reached, the fan can operate completely. After operating completely for a while, the activation unit 10b will drop down the voltage to the range that is defined by the idle speed regulation unit 11b. As the fan speed defined by the idle speed regulation unit 11b is fixed, the client end is unable to adjust by oneself. On the other hand, the client end will configure the temperature transition unit 12b to define a pre-determined temperature (e.g., 40° C.). When the fan keeps at the original rotation speed that is defined by the idle speed regulation unit 11b and the temperature reaches the temperature that is defined by the temperature transition unit 12b, the fan speed will increase. When the fan is operating, the drive signal is provided to the drive unit 15b properly in proportion to the temperature through the multiplexer 14b by the positive temperature regulation slope unit 13b. The rotation speed is increased by increasing the drive energy and when the temperature reaches a pre-determined temperature (e.g., 80° C.), the fan can achieve the full speed. The aforementioned functions can be achieved by this kind of chip with only 4 pins; therefore, the rotation speed will not be decreased by the foreign objects when the fan is operating, and the production cost can be reduced by effectively decreasing the PCB area, due to that the pins are decreased.

It is of course to be understood that the embodiments described herein is merely illustrative of the principles of the invention and that a wide variety of modifications thereto may be effected by persons skilled in the art without departing from the spirit and scope of the invention as set forth in the following claims.

What is claimed is:

1. A low-pin count fan speed control system which is a chip to control operation of the fan, the chip comprising:
   an activation unit, which provides a pre-determined voltage and drives a fan to rotate;
   an idle speed regulation unit, which is connected with the activation unit and limits the fan to slow down to a pre-determined rotation speed after the fan starts completely;
   temperature transition unit, which increases the fan speed when the fan slows down to the pre-determined rotation speed and a temperature reaches to a pre-determined temperature;
   a positive temperature regulation slope unit, which properly increases the rotation speed in proportional to the temperature when the fan is accelerating, with the fan achieving a full speed upon operating to a condition that the temperature reaches a pre-determined temperature; and
   an over-temperature protection unit, which is activated when the fan is operating at the full speed and the temperature rises to a pre-determined temperature.

2. The low-pin count fan speed control system according to claim 1, wherein the temperature transition unit and the positive temperature regulation slope unit provides a drive signal to a drive unit, through a multiplexer.

3. The low-pin count fan speed control system according to claim 1, wherein the idle speed regulation unit is further an adjustable unit with a pre-determined operating speed being changed freely as required, or a non-adjustable unit with a fixed range of pre-determined operating speed.

4. The low-pin count fan speed control system according to claim 2, wherein the activation unit and the drive unit are further a linear control unit or a PWM (Pulse Width Modulation) unit.

5. A low-pin count fan speed control method, comprising:
   a) using the activation unit to drive the fan by a voltage in a pre-determined range to operate quickly;
   b) slowing down the fan after the fan starts, and restricting the operating speed in a pre-determined range through the idle speed regulation unit;
   c) starting to increase the fan speed through the temperature transition unit when the pre-determined rotation speed that the fan is operating at reaches a condition that the temperature rises to a pre-determined temperature;
   d) the fan achieving a full speed when the temperature reaches a pre-determined temperature which is set up by the positive temperature regulation slop unit;
   e) the over-temperature protection unit activating the protective notification function when the temperature rises to a pre-determined temperature; and
   f) the drive unit producing a different drive signal through the multiplexer when the fan speed changes with the pre-determined temperature.

6. The low-pin count fan speed control method according to claim 5, wherein the idle speed regulation unit is further an adjustable unit with a pre-determined operating speed being changed freely as required, or a non-adjustable unit with a fixed range of pre-determined operating speed.

7. The low-pin count fan speed control method according to claim 5, wherein the activation unit and the drive unit are further a linear control unit or a PWM (Pulse Width Modulation) unit.

* * * * *